(12) United States Patent
Chen

(10) Patent No.: US 12,376,244 B2
(45) Date of Patent: Jul. 29, 2025

(54) COMMUNICATION DEVICE OF MAINTAINING SIGNAL TRANSMISSION BETWEEN EXTERNAL DEVICES

(71) Applicant: TCC RFTECH Co., Ltd., New Taipei (TW)

(72) Inventor: Yu-Kuang Chen, New Taipei (TW)

(73) Assignee: TCC RFTECH Co., Ltd., New Taipei (TW)

( * ) Notice: Subject to any disclaimer, the term of this patent is extended or adjusted under 35 U.S.C. 154(b) by 169 days.

(21) Appl. No.: 18/504,103

(22) Filed: Nov. 7, 2023

(65) Prior Publication Data

US 2025/0120023 A1    Apr. 10, 2025

(30) Foreign Application Priority Data

Oct. 6, 2023    (TW) ................................ 112138448

(51) Int. Cl.
| | |
|---|---|
| *H04N 7/10* | (2006.01) |
| *H05K 5/02* | (2006.01) |
| *H05K 5/03* | (2006.01) |
| *H05K 5/13* | (2025.01) |

(52) U.S. Cl.
CPC .......... *H05K 5/0217* (2013.01); *H04N 7/104* (2013.01); *H05K 5/03* (2013.01); *H05K 5/13* (2025.01)

(58) Field of Classification Search
CPC .......... H05K 5/0217; H05K 5/03; H05K 5/13; H04N 7/104
See application file for complete search history.

(56) References Cited

U.S. PATENT DOCUMENTS

| | | | | |
|---|---|---|---|---|
| 4,755,776 | A | * | 7/1988 | Preschutti ................ H03H 7/46 333/132 |
| 5,756,935 | A | * | 5/1998 | Balanovsky ......... H01R 24/547 200/51.09 |
| 5,909,154 | A | | 6/1999 | Brown |
| 5,990,758 | A | * | 11/1999 | Matsubara ............. H01R 25/00 333/100 |

(Continued)

FOREIGN PATENT DOCUMENTS

| | | |
|---|---|---|
| CN | 204361420 U | 5/2015 |
| TW | 169746 | 9/1991 |

*Primary Examiner* — Imani N Hayman
*Assistant Examiner* — Theron S Milliser
(74) *Attorney, Agent, or Firm* — Winston Hsu

(57) ABSTRACT

A communication device includes a case, a cover, a signal processing module and a signal switching module. The cover whereon the signal processing module is disposed is detachably assembled with the case. The signal switching module is disposed on the case and includes a connection component and a conductive component. The connection element includes a switching element, a chamber, a device port and a module port. The device port is connected to external devices. The switching element is movably disposed inside the chamber. The conductive component is located inside the case, and is spaced from the device port by the switching element when a signal transmission terminal of the signal processing module is inserted into the module port, and further contacts against the device port when the signal transmission terminal is removed from the module port, so as to maintain signal transmission between external devices.

15 Claims, 7 Drawing Sheets

(56) References Cited

U.S. PATENT DOCUMENTS

| | | | | |
|---|---|---|---|---|
| 5,994,976 A * | 11/1999 | Tang | | H01R 9/0506 |
| | | | | 333/100 |
| 6,074,250 A * | 6/2000 | Tang | | H01R 9/0506 |
| | | | | 439/579 |
| 6,129,597 A * | 10/2000 | Gresko | | H01R 24/52 |
| | | | | 439/583 |
| 6,262,636 B1 | 7/2001 | McLain | | |
| 6,292,371 B1 | 9/2001 | Toner, Jr. | | |
| 6,593,830 B2 * | 7/2003 | Wu | | H01R 24/46 |
| | | | | 725/127 |
| 7,807,935 B2 * | 10/2010 | Tang | | H01R 24/46 |
| | | | | 333/100 |
| 9,113,187 B2 * | 8/2015 | Conroy | | H04N 21/6168 |
| 9,661,263 B2 * | 5/2017 | Chang | | H04N 7/104 |
| 11,539,176 B2 * | 12/2022 | Henningsen | | H01R 24/547 |
| 11,545,799 B2 * | 1/2023 | Lee | | H01R 13/646 |
| 11,665,314 B2 * | 5/2023 | Lee | | H04N 7/104 |
| | | | | 725/127 |
| 11,901,679 B2 * | 2/2024 | Henningsen | | H01R 31/02 |
| 12,206,211 B2 * | 1/2025 | Henningsen | | H01R 31/02 |
| 2003/0112093 A1 * | 6/2003 | Wu | | H01R 24/46 |
| | | | | 333/136 |
| 2008/0107016 A1 * | 5/2008 | Tang | | H01R 24/46 |
| | | | | 370/217 |
| 2013/0111539 A1 * | 5/2013 | Egan | | H04N 7/106 |
| | | | | 725/151 |
| 2015/0067755 A1 * | 3/2015 | Conroy | | H04N 21/6156 |
| | | | | 725/127 |
| 2016/0113140 A1 * | 4/2016 | Chang | | H04N 7/104 |
| | | | | 361/679.01 |
| 2020/0266822 A1 | 8/2020 | Tsuji | | |
| 2021/0091519 A1 * | 3/2021 | Henningsen | | H01R 31/02 |
| 2021/0135415 A1 * | 5/2021 | Lee | | H05K 5/0069 |
| 2021/0337165 A1 * | 10/2021 | Lee | | H04N 7/104 |
| 2023/0102781 A1 * | 3/2023 | Henningsen | | H01R 31/02 |
| | | | | 174/250 |
| 2024/0186754 A1 * | 6/2024 | Henningsen | | H01R 31/02 |
| 2025/0120023 A1 * | 4/2025 | Chen | | H04N 7/104 |

* cited by examiner

COMMUNICATION DEVICE OF MAINTAINING SIGNAL TRANSMISSION BETWEEN EXTERNAL DEVICES

BACKGROUND OF THE INVENTION

1. Field of the Invention

The present invention relates to a communication device, and more particularly, to a communication device of maintaining signal transmission between different devices.

2. Description of the Prior Art

In the common cable television communication system, each node on the main loop can have a splitter. Different external electronic devices are respectively installed on the front end and the rear end of the splitter, and the plural splitters and the related external electronic devices are electrically connected with each other in series. The splitter may be repaired or replaced; the control circuit board inside the splitter can be removed and then installed back into the splitter after being repaired or replaced. However, the signal transmission path of the main loop is interrupted when the splitter is repaired or replaced, Design of the splitter (or can be interpreted as the communication device) of keeping the signal transmission path between the front-end and rear-end external electronic devices clear during the circuit board maintenance process is an important issue in the related mechanical design industry.

SUMMARY OF THE INVENTION

The present invention provides communication device of maintaining signal transmission between different devices for solving above drawbacks.

According to the claimed invention, a communication device of maintaining signal transmission between a front-end device and a rear-end device is disclosed. The communication device includes a case, a cover, a signal processing module and a signal switching module. The case has an accommodating space. The cover is detachably assembled with the case to cover the accommodating space. The signal processing module is disposed inside the case, and includes at least one signal transmission terminal disposed on position of the signal processing module facing the accommodating space. The signal switching module is disposed on the case and includes at least one connection component and a conductive component. The at least one connection component has a switching element, a chamber, a device port and a module port. The chamber is connected with the device port and the module port, and the device port is electrically connected to the front-end device or the rear-end device, and the switching element is movably disposed inside the chamber. The conductive component is located inside the accommodating space. The conductive component is pressed by the switching element to space from the device port when the at least one signal transmission terminal is inserted into the module port and pushes the switching element in a specific direction, and further pushes the switching element in a direction opposite to the specific direction for contacting against the at least one connection component when the at least one signal transmission terminal is removed from the module port, so as to maintain the signal transmission between the front-end device and the rear-end device.

According to the claimed invention, the communication device further includes an isolation component disposed inside the case, and attached to the conductive component for constraining a movement of the conductive component inside the accommodating space. The isolation component includes a main body, an input isolation portion and an output isolation portion. The main body is located between two opening ends of the case, and the input isolation portion is located adjacent to one of the two opening ends, and the output isolation portion is located adjacent to the other opening end.

The communication device of the present invention can have specific design of the connection component and the conductive component of the signal switching module; when the case is assembled with the cover, the conductive component can be pushed by the switching element to be deformed and separated from the device port from the connection component, so that a signal transmission path between the front-end device and the rear-end device can be set in order as: the front-end device, the input connection component, the signal input terminal, the signal processing circuit board, the signal output terminal, the output connection component and the rear-end device. When the case is disassembled from the cover, the switching element can be pushed by the conductive component to contact against the device port of the connection component, and the signal transmission path between the front-end device and the rear-end device can be set in order as: the front-end device, the input connection component, the conductive component, the output connection component and the rear-end device. Therefore, the communication device of the present invention can always maintain the signal transmission between the front-end device and the rear-end device in response to assembly or disassembly of the case and the cover.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
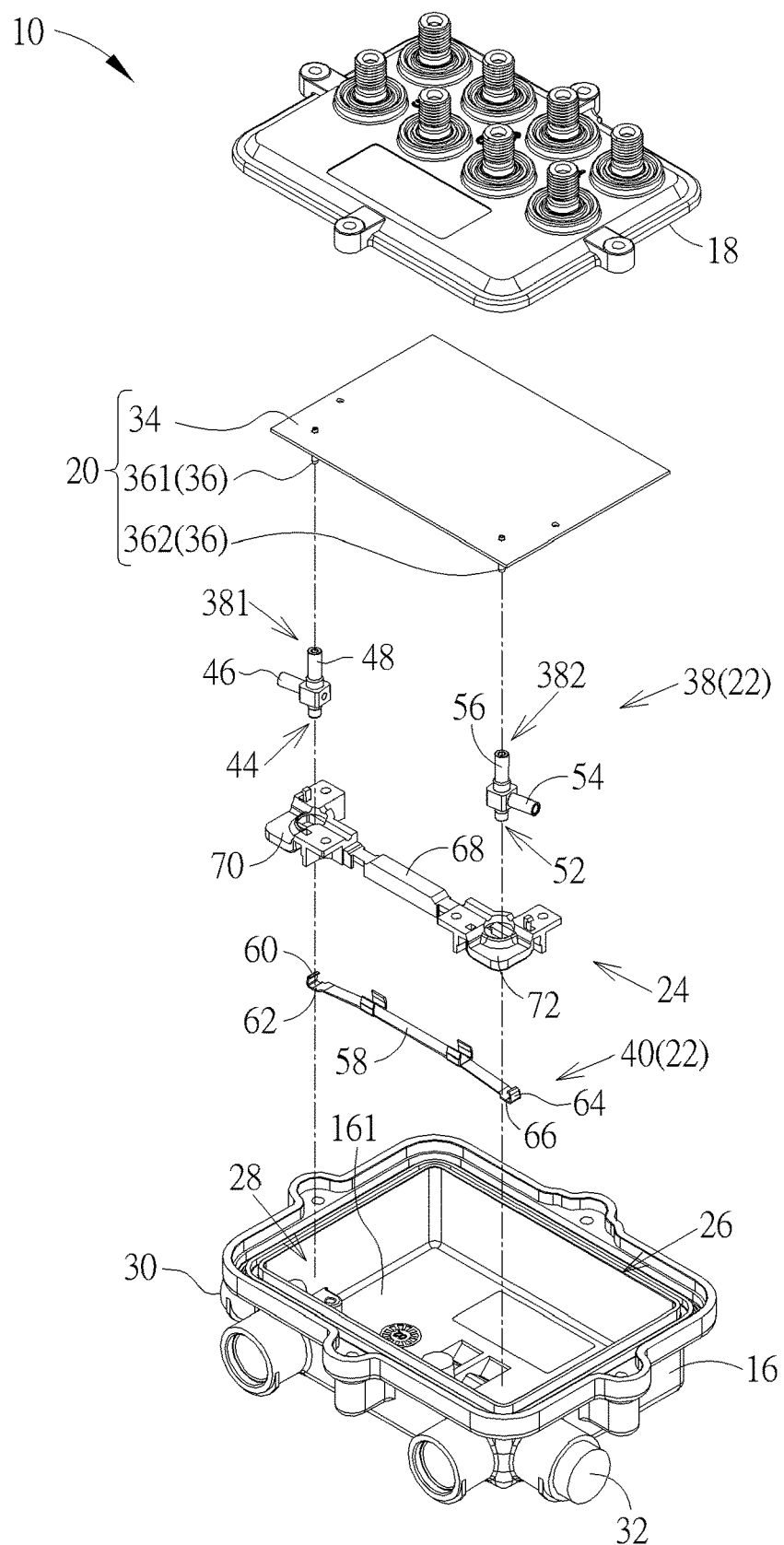
FIG. 1 and FIG. 2 are exploded diagrams of a communication device in different views according to an embodiment of the present invention.
Figure 2:
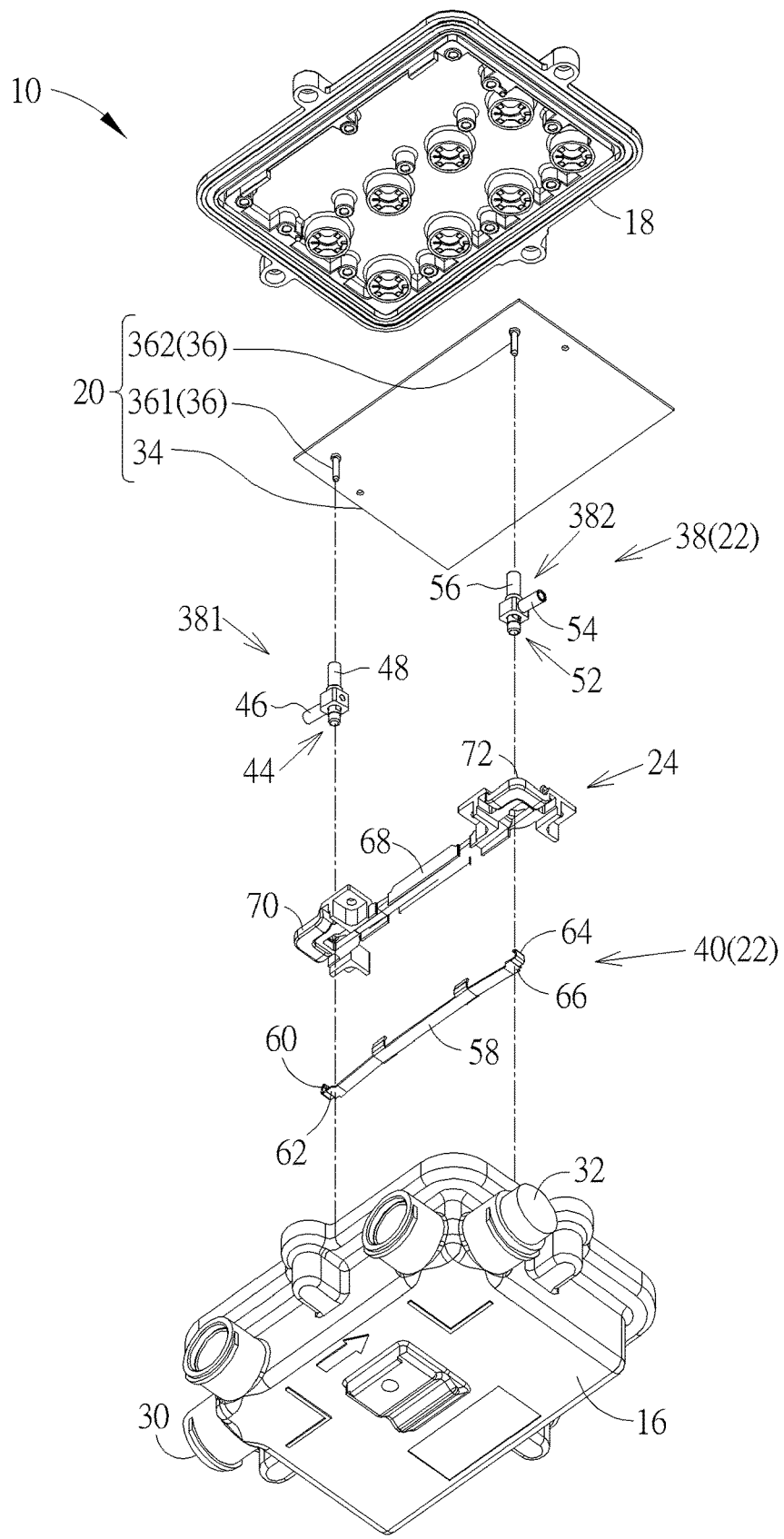
Figure 3:
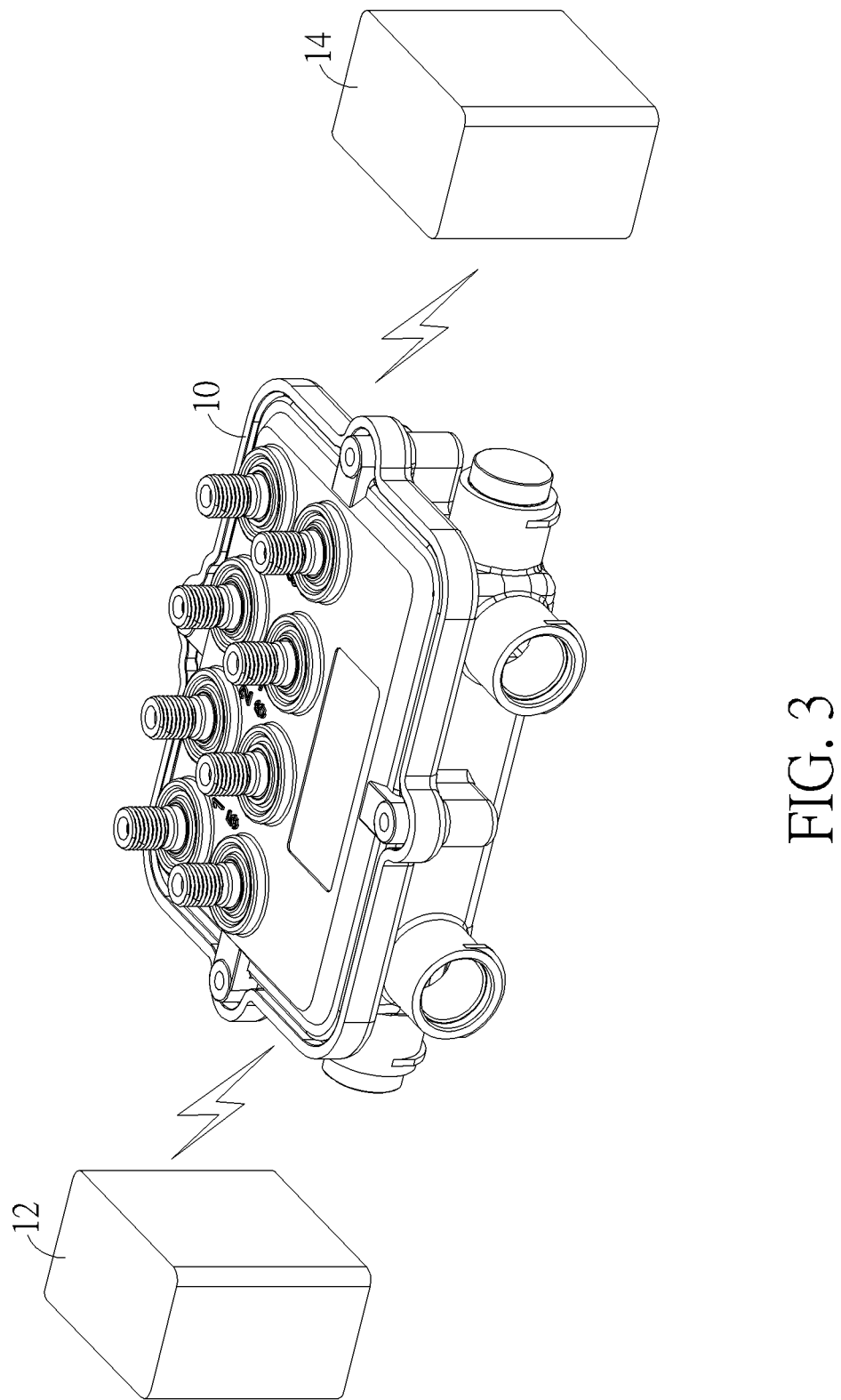
FIG. 3 is an application diagram of the communication device with other devices according to the embodiment of the present invention.

Please refer to FIG. 1 to FIG. 3. FIG. 1 and FIG. 2 are exploded diagrams of a communication device 10 in different views according to an embodiment of the present invention. FIG. 3 is an application diagram of the communication device 10 with other devices according to the embodiment of the present invention. The communication device 10 can be applied to a cable television system, or any communication system with a signal series feature. The communication device 10 can be a splitter at least disposed between a front-end device 12 and a rear-end device 14. The front-end device 12 and the rear-end device 14 can be interpreted as external devices that can receive and transmit signals from the communication device 10. The communication device 10 of the present invention can maintain signal transmission between the front-end device 12 and the rear-end device 14 when inner circuits of the communication device 10 is repaired or replaced, so as to avoid signal interruption between the front-end device 12 and the rear-end device 14 in the maintenance process.

The communication device 10 can include a case 16, a cover 18, a signal processing module 20, a signal switching module 22 and an isolation component 24. The case 16 can have an open portion 26, an accommodating space 28, an input opening end 30 and an output opening end 32. The open portion 26 can be connected to inner of the accommodating space 28, and components inside the accommodating space 28 can be removed or installed through the open portion 26. The input opening end 30 and the output opening end 32 can be connected to the open portion 26 and the accommodating space 28. The cover 18 can be installed on the open portion 26 of the case 16 in a detachable manner, and used to cover and seal the accommodating space 28 for preventing the communication device 10 from being interfered by dust, liquid or noise. Shapes of the case 16 and the cover 18 are not limited to the embodiment shown in the figures, and depend on a design demand.

The signal processing module 20 can be disposed on the cover 18, and can be separated from the case 16 when the cover 18 is detached from the case 16. The signal processing module 20 can include a signal processing circuit board 34 and a signal transmission terminal 36. The signal processing circuit board 34 can be disposed inside the cover 18. The signal transmission terminal 36 can be disposed on the signal processing circuit board 34 to face towards the accommodating space 28. A number of the signal transmission terminal 36 can depend on the design demand. For example, if the communication device 10 is located between two external devices (such as the front-end device 12 and the rear-end device 14), the signal transmission terminal 36 can include a signal input terminal 361 and a signal output terminal 362. The signal input terminal 361 and the signal output terminal 362 can be respectively disposed on different positions on the signal processing circuit board 34 and electrically connected with each other via circuits on the signal processing circuit board 34.

In any possible embodiment of the present invention, the signal processing circuit board 34 can be installed on the cover 18 in a screw locking manner or in a structural engagement manner. The signal processing circuit board 34 can be used for distribution, attenuation or a combination of radio frequency signals; actual application of the signal processing circuit board 34 is not limited to the foresaid embodiment, and a detailed description is omitted herein for simplicity.

Figure 4:
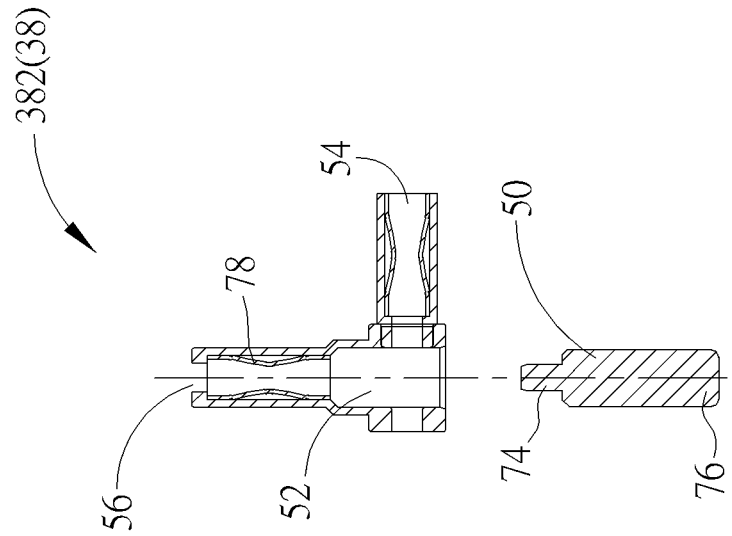
FIG. 4 is a sectional view of a connection component according to the embodiment of the present invention.
Figure 4:
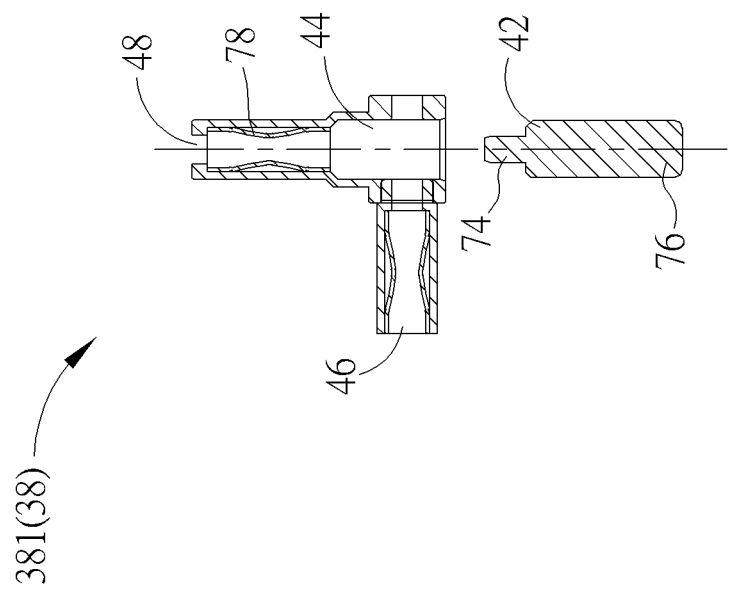
Figure 5:
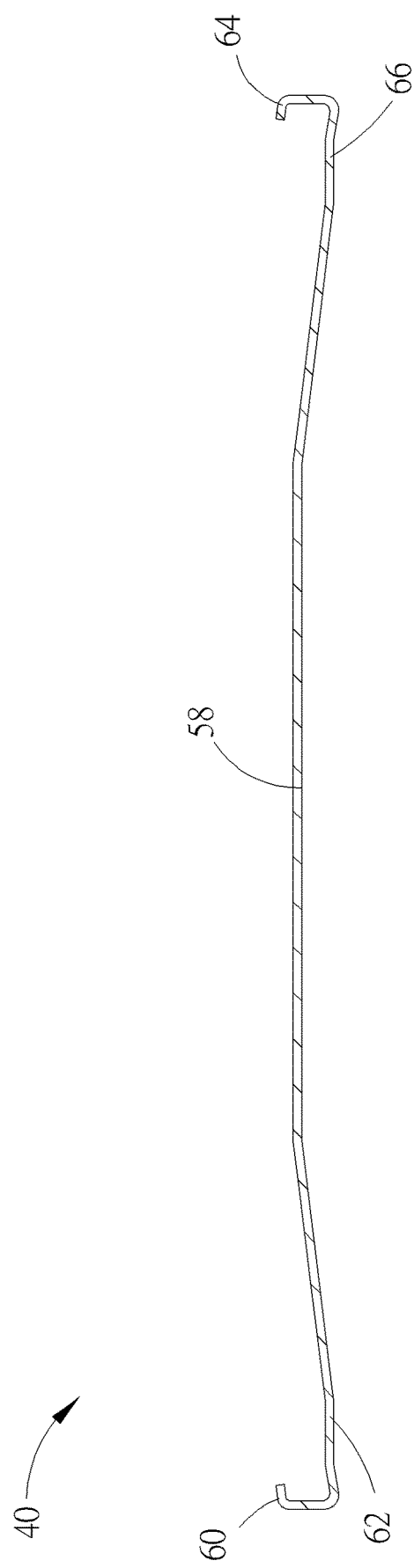
FIG. 5 is a sectional view of a conductive component according to the embodiment of the present invention.

The signal switching module 22 can be disposed inside the case 16, and can include a connection component 38 and a conductive component 40. Please refer to FIG. 4 and FIG. 5. FIG. 4 is a sectional view of the connection component 38 according to the embodiment of the present invention. FIG. 5 is a sectional view of the conductive component 40 according to the embodiment of the present invention. A number of the connection component 38 can depend on numbers of the external device and the signal transmission terminal 36. In the preferred embodiment of the present invention, the connection component 38 can include an input connection component 381 and an output connection component 382, respectively disposed on position corresponding to the input opening end 30 and the output opening end 32 of the case 16. The input connection component 381 can include a first switching element 42, and further include a first chamber 44, a first device port 46 and a first module port 48 connected with each other. The first switching element 42 can be movably disposed inside the first chamber 44. The first device port 46 can be electrically connected with the front-end device 12. The first module port 48 can be electrically connected with the signal input terminal 361 of the signal processing module 20.

Accordingly, the output connection component 382 can include a second switching element 50, and further include a second chamber 52, a second device port 54 and a second module port 56 connected with each other. The second switching element 50 can be movably disposed inside the second chamber 52. The second device port 54 can be electrically connected with the rear-end device 14. The second module port 56 can be electrically connected with the signal output terminal 362 of the signal processing module 20.

The conductive component 40 can be disposed inside the accommodating space 28, and further include a connection portion 58, a first conduction portion 60, a first abutting portion 62, a second conduction portion 64 and a second abutting portion 66. The connection portion 58 can be connected with the isolation component 24 to position inside the accommodating space 28. The first abutting portion 62 and the second abutting portion 66 can be respectively extended from two opposite ends of the connection portion 58. The first conduction portion 60 can be disposed on an end of the first abutting portion 62 opposite to the connection portion 58, and upwardly extended to face the input connection component 381. The second conduction portion 64 can be disposed on an end of the second abutting portion 66 opposite to the connection portion 58, and upwardly extended to face the output connection component 382.

The isolation component 24 can be disposed inside the case 16, and be attached to the conductive component 40 of the signal switching module 22 for constraining a movement of the conductive component 40 inside the accommodating space 28. The isolation component 24 can include a main body 68, an input isolation portion 70 and an output isolation portion 72. The main body 68 can be located between the input opening end 30 and the output opening end 32 of the case 16. The input isolation portion 70 can be disposed adjacent to the input opening end 30, and the output isolation portion 72 can be disposed adjacent to the output opening end 32. In any possible embodiment of the present invention, the main body 68 can be monolithically integrated with the input isolation portion 70 and the output isolation portion 72, or can be separated from the input isolation portion 70 and the output isolation portion 72 to individually dispose on corresponding positions inside the case 16; arrangement of the main body 68 can depend on the design demand, and the detailed description is omitted herein for simplicity.

Please refer to FIG. 1, FIG. 2 and FIG. 4. The input connection component 381 and the output connection component 382 can be made of conductive material. The input connection component 381 can be disposed on the input isolation portion 70 of the isolation component 24 to space from the case 16, and be not electrically connected with the case 16. The output connection component 382 can be disposed on the output isolation portion 72 of the isolation component 24 to space from the case 16, and be not electrically connected with the case 16. For the signal switching function, the first switching element 42 and the second switching element 50 can be made of isolation material, and each of the first switching element 42 and the second switching element 50 can include a top end 74 and a bottom end 76 opposite to each other. The top end 74 of the first switching element 42 can be inserted into the input connection component 381 to move towards the first module port 48 for detachably contacting against the signal input terminal 361; the bottom end 76 of the first switching element 42 can be protruded from the first chamber 44 to contact against the first abutting portion 62 of the conductive component 40.

Accordingly, the top end 74 of the second switching element 50 can be inserted into the output connection component 382 to move towards the second module port 56 for detachably contacting against the signal output terminal 362; the bottom end 76 of the second switching element 50 can be protruded from the second chamber 52 to contact against the second abutting portion 66 of the conductive component 40. Besides, both of the first module port 48 and the second module port 56 can have a conductive clip 78 used to clip and position the signal input terminal 361 and the signal output terminal 362. Both of the first device port 46 and the second device port 54 can have a conductive clip 80 similar to the conductive clip 78, and used to clip and position connection pins (which are not marked in the figures) of the front-end device 12 and the rear-end device 14.

Please refer to FIG. 1, FIG. 2 and FIG. 5. The connection portion 58 of the conductive component 40 can be fixed to the isolation component 24 for being spaced from the bottom portion 161 of the case 16. The first abutting portion 62 and the second abutting portion 66 can be waved relative to the connection portion 58 in the specific direction D, and space between the connection portion 58 and the bottom portion 161 can be defined as an allowable range of waving of the first abutting portion 62 (or the second abutting portion 66). The conductive component 40 can be made of the conductive material with a resiliently deformable feature, such as metal. When the conductive component 40 is not pressed by an external force, the first conduction portion 60 can contact against the first device port 46 of the input connection component 381, and the second conduction portion 64 can contact against the second device port 54 of the output connection component 382 when the conductive component 40 is set in an original state. The conductive component 40 can be resiliently deformed to store a resilient recovering force due to pressure of the external force, and the first abutting portion 62 and the second abutting portion 66 can contact against the bottom portion 161 of the case 16; when the external force applied to the conductive component 40 is removed, the resilient recovering force is released to recover the conductive component 40 back to the original state.

Moreover, the first conduction portion 60 can be upwardly extended relative to the first abutting portion 62, and a extending length of the first conduction portion 60 can be greater than a protruding length of the bottom end 76 of the first switching element 42 relative to the first chamber 44, so as to effectively contact against the first device port 46 of the input connection component 381. Accordingly, the second conduction portion 64 can be upwardly extended relative to the second abutting portion 66, and the extending length of the second conduction portion 64 can be greater than a protruding length of the bottom end 76 of the second switching element 50 relative to the second chamber 52, so as to effectively contact against the second device port 54 of the output connection component 382. Shapes of the first conduction portion 60 and the second conduction portion 64 are not limited to the embodiment shown in FIG. 5, which depend on the design demand.

Figure 6:
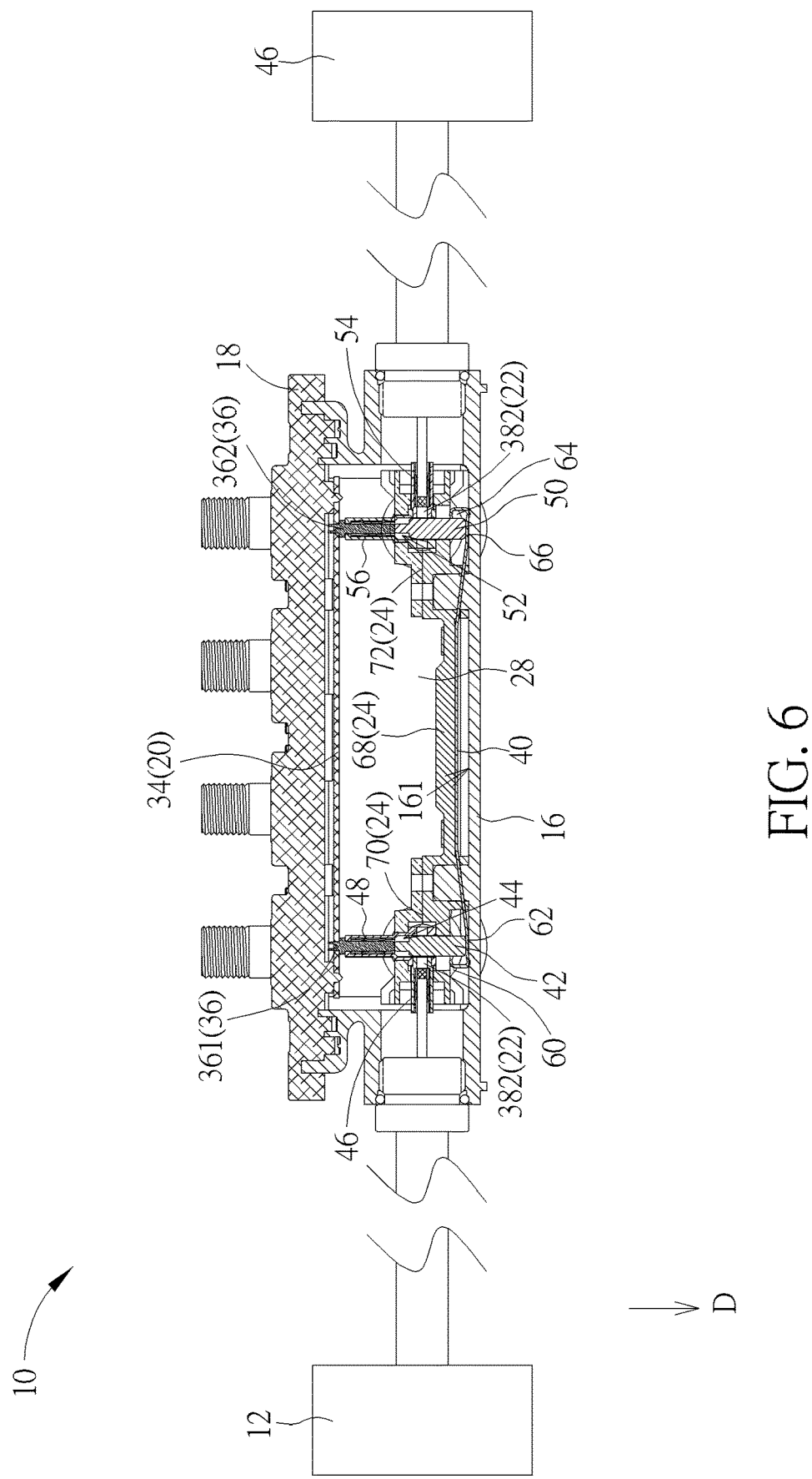
FIG. 6 and FIG. 7 are sectional views of the communication device in different operation modes according to the embodiment of the present invention.
Figure 7:
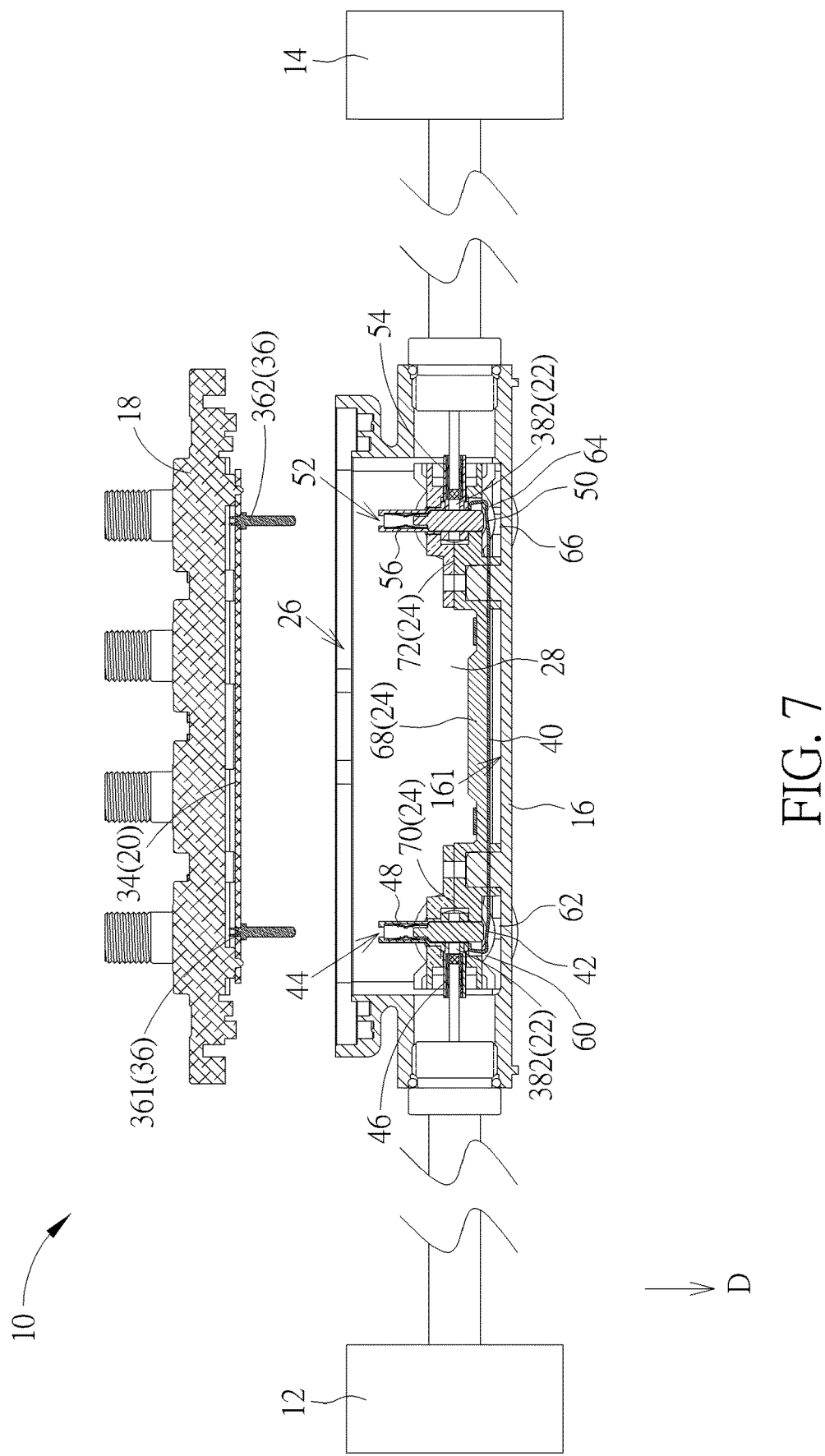

Please refer to FIG. 1, FIG. 4, FIG. 6 and FIG. 7. FIG. 6 and FIG. 7 are sectional views of the communication device 10 in different operation modes according to the embodiment of the present invention. As shown in FIG. 6, the cover 18 is assembled with the case 16, and the signal input terminal 361 of the signal processing module 20 can be inserted into the first module port 48 of the input connection component 381 of the signal switching module 22, and the signal output terminal 362 can be inserted into the second module port 56 of the output connection component 382. In the meantime, the signal input terminal 361 can push the top end 74 of the first switching element 42 to move inside the first chamber 44 in the specific direction D, and the first abutting portion 62 of the conductive component 40 can be pressed by the bottom end 76 of the first switching element 42, so as to separate the first conduction portion 60 from the first device port 46 and further to contact the first abutting portion 62 against the bottom portion 161 of the case 16; accordingly, the signal output terminal 362 can further push the top end 74 of the second switching element 50 inside the second chamber 52 in the specific direction D, and the second abutting portion 66 of the conductive component 40 can be pressed by the bottom end 76 of the second switching element 50, so as to separate the second conduction portion 64 from the second device port 54 and further to contact the second abutting portion 66 against the bottom portion 161 of the case 16.

As shown in FIG. 7, the cover 18 is disassembled from the case 16, and the signal input terminal 361 can be removed from the first module port 48 of the input connection component 381, and the signal output terminal 362 can be removed from the second module port 56 of the output connection component 382. At the time, the first switching element 42 is not pressed by the signal input terminal 361, and the second switching element 50 is not pressed by the signal output terminal 362, so that the resilient recovering force of the conductive component 40 can be released to upwardly push the first switching element 42 and the second switching element 50 in the specific direction D, for driving the first abutting portion 62 to be separated from the case 16 for contacting the first conduction portion 60 against the first device port 46, and further driving the second abutting portion 66 to be separated from the case 16 for contacting the second conduction portion 64 against the second device port 54.

In conclusion, the communication device of the present invention can have specific design of the connection component and the conductive component of the signal switching module; when the case is assembled with the cover, the conductive component can be pushed by the switching element to be deformed and separated from the device port from the connection component, so that a signal transmission path between the front-end device and the rear-end device can be set in order as: the front-end device, the input connection component, the signal input terminal, the signal processing circuit board, the signal output terminal, the output connection component and the rear-end device. When the case is disassembled from the cover, the switching element can be pushed by the conductive component to contact against the device port of the connection component, and the signal transmission path between the front-end device and the rear-end device can be set in order as: the front-end device, the input connection component, the conductive component, the output connection component and the rear-end device. Therefore, the communication device of the present invention can always maintain the signal transmission between the front-end device and the rear-end device in response to assembly or disassembly of the case and the cover.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A communication device of maintaining signal transmission between a front-end device and a rear-end device, the communication device comprising:
   a case having an accommodating space;
   a cover detachably assembled with the case to cover the accommodating space;
   a signal processing module disposed inside the case, and comprising at least one signal transmission terminal disposed on position of the signal processing module facing the accommodating space; and
   a signal switching module disposed on the case and comprising:
      at least one connection component, having a switching element, a chamber, a device port and a module port, the chamber being connected with the device port and the module port, the device port being electrically connected to the front-end device or the rear-end device, the switching element being movably disposed inside the chamber; and
      a conductive component located inside the accommodating space, the conductive component being pressed by the switching element to space from the device port when the at least one signal transmission terminal is inserted into the module port and pushes the switching element in a specific direction, and further pushing the switching element in a direction opposite to the specific direction for contacting against the at least one connection component when the at least one signal transmission terminal is removed from the module port, so as to maintain the signal transmission between the front-end device and the rear-end device.

2. The communication device of claim 1, wherein the signal processing module further comprises a signal processing circuit board, the at least one signal transmission terminal comprises a signal input terminal and a signal output terminal respectively disposed on different positions on the signal processing circuit board and electrically connected with each other.

3. The communication device of claim 2, wherein the signal processing circuit board is assembled with the cover in a screw locking manner or in a structural engagement manner.

4. The communication device of claim 1, further comprising:
   an isolation component disposed inside the case, and attached to the conductive component for constraining a movement of the conductive component inside the accommodating space.

5. The communication device of claim 4, wherein the isolation component comprises a main body, an input isolation portion and an output isolation portion, the main body is located between two opening ends of the case, the input isolation portion is located adjacent to one of the two opening ends, and the output isolation portion is located adjacent to the other opening end.

6. The communication device of claim 5, wherein the main body is monolithically integrated with the input isolation portion and the output isolation portion, or the main body is separated from the input isolation portion and the output isolation portion.

7. The communication device of claim 1, wherein the communication device further comprises an isolation component, the at least one connection component comprises an input connection component and an output connection component, the input connection component is disposed on an input isolation portion of the isolation component to space from the case, the output connection component is disposed on an output isolation portion of the isolation component to space from the case.

8. The communication device of claim 1, wherein the at least one connection component is made of conductive material, and is electrically connected with the at least one signal transmission terminal or the conductive component in a switchable manner according to a movement of the switching element.

9. The communication device of claim 1, wherein the switching element is made of isolation material and has a top end and a bottom end opposite to each other, the top end is inserted into the device port of the at least one connection component to detachably contact against the at least one signal transmission terminal, the bottom end is protruded from the chamber to contact against the conductive component.

10. The communication device of claim 1, wherein the conductive component comprises a connection portion, at least one conduction portion and at least one abutting portion, the at least one abutting portion is outwardly extended from the connection portion, the at least one conduction portion is connected to an end of the at least one abutting portion opposite to the connection portion.

11. The communication device of claim 10, wherein the at least one conduction portion is extended towards the at least one connection component from the at least one abutting portion, and an extending length of the at least one conduction portion relative to the at least one abutting portion is greater than a protruding length of the switching element relative to the chamber.

12. The communication device of claim 10, wherein the communication device further comprises an isolation component disposed inside the case, the connection portion is connected with the isolation component to space from a bottom portion of the case, and the at least one abutting portion is waved relative to the connection portion in the specific direction.

13. The communication device of claim 10, wherein the at least one abutting portion contacts against a bottom portion of the case when the at least one conduction portion is removed from the device port.

14. The communication device of claim 10, wherein the connection portion is resiliently deformed to store a resilient recovering force when being pressed by the switching element, the resilient recovering force is adapted to separate the at least one abutting portion from the case for contacting the at least one conduction portion against the device port.

15. The communication device of claim 10, wherein the at least one connection component comprises an input connection component and an output connection component, the at least one conduction portion comprises a first conduction portion and a second conduction portion, the at least one abutting portion comprises a first abutting portion and a second abutting portion, the first conduction portion and the first abutting portion are set relevant to the input connection component, the second conduction portion and the second abutting portion are set relevant to the output connection component.

\* \* \* \* \*